United States Patent
Seo et al.

(10) Patent No.: US 9,379,727 B1
(45) Date of Patent: Jun. 28, 2016

(54) TRANSMIT DIGITAL TO ANALOG CONVERTER (DAC) SPUR ATTENUATION

(71) Applicant: QUALCOMM Incorporated, San Diego, CA (US)

(72) Inventors: Dongwon Seo, San Diego, CA (US); Yang You, Dallas, TX (US); Honghao Ji, San Diego, CA (US); Tongyu Song, San Diego, CA (US); Ganesh Saripalli, San Diego, CA (US); Shahin Mehdizad Taleie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/628,996

(22) Filed: Feb. 23, 2015

(51) Int. Cl.
| | |
|---|---|
| *H03M 1/06* | (2006.01) |
| *H03M 1/70* | (2006.01) |
| *H04B 1/04* | (2006.01) |
| *G05F 3/18* | (2006.01) |
| *G05F 1/56* | (2006.01) |
| *H03M 1/00* | (2006.01) |
| *H03M 1/74* | (2006.01) |
| *G05F 1/575* | (2006.01) |
| *H02M 3/156* | (2006.01) |

(52) U.S. Cl.
CPC ............. *H03M 1/0604* (2013.01); *H03M 1/70* (2013.01); *H04B 1/0475* (2013.01); *G05F 1/56* (2013.01); *G05F 1/575* (2013.01); *G05F 3/18* (2013.01); *H02M 3/156* (2013.01); *H03M 1/00* (2013.01); *H03M 1/747* (2013.01); *H04B 2001/0408* (2013.01)

(58) Field of Classification Search
CPC ........... H03M 1/00; H03M 1/747; G05F 1/56; G05F 1/575; G05F 3/18; H02M 3/156
USPC .......... 341/118, 144; 323/303, 280, 282, 270, 323/311
See application file for complete search history.

(56) References Cited

U.S. PATENT DOCUMENTS

| | | | |
|---|---|---|---|
| 6,522,114 B1 | 2/2003 | Bakker et al. | |
| 8,294,441 B2 | 10/2012 | Gurcan et al. | |
| 8,305,056 B2 | 11/2012 | Wadhwa | |
| 2014/0084896 A1 | 3/2014 | Zhang et al. | |
| 2014/0139029 A1* | 5/2014 | Gasparini | G06F 1/26 307/80 |
| 2014/0223205 A1 | 8/2014 | Muthukaruppan et al. | |
| 2015/0022177 A1* | 1/2015 | Petrovic | G05F 1/575 323/303 |

* cited by examiner

*Primary Examiner* — Joseph Lauture
(74) *Attorney, Agent, or Firm* — Loza & Loza LLP

(57) ABSTRACT

A method and apparatus for attenuating transmit digital to analog converter (DAC) spurs is provided. The method begins when a reference voltage is injected into an amplifier. Next, an output of the ground low drop-out regulator is measured and is them compared with the reference voltage. The output of the amplifier is then adjusted based on the results of the comparison. If the reference voltage is higher then the output of the ground low drop-out regulator the output of the amplifier is adjusted to ground. If the reference voltage is lower than the output of the ground low drop-out regulator then the output of the amplifier is adjusted to match the reference voltage.

22 Claims, 9 Drawing Sheets

US 9,379,727 B1

TRANSMIT DIGITAL TO ANALOG CONVERTER (DAC) SPUR ATTENUATION

FIELD

The present disclosure relates generally to wireless communication systems, and more particularly to a method and apparatus for attenuating transmit digital to analog converter (DAC) spurs using a ground low dropout regulator.

BACKGROUND

Wireless communication devices have become smaller and more powerful as well as more capable. Increasingly users rely on wireless communication devices for mobile phone use as well as email and Internet access. At the same time, devices have become smaller in size. In addition, devices may now incorporate multiple transmitters and antennas. These factors may increase a user's exposure to radio frequency (RF) radiation. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipments, and similar terms.

A wireless communication system may support communication for multiple wireless communication devices at the same time. In use, a wireless communication device may communicate with one or more base stations by transmissions on the uplink and downlink. Base stations may be referred to as access points, Node Bs, or other similar terms. The uplink or reverse link refers to the communication link from the wireless communication device to the base station, while the downlink or forward link refers to the communication from the base station to the wireless communication devices.

Wireless communication systems may be multiple access systems capable of supporting communication with multiple users by sharing the available system resources, such as bandwidth and transmit power. Examples of such multiple access systems include code division multiple access (CDMA) systems, time division multiple access (TDMA) systems, frequency division multiple access (FDMA) systems, wideband code division multiple access (WCDMA) systems, global system for mobile (GSM) communication systems, enhanced data rates for GSM evolution (EDGE) systems, and orthogonal frequency division multiple access (OFDMA) systems.

Wireless devices may incorporate a system-on-chip (SoC) to perform many of the functions described above. Modern SoCs integrate sensitive analog/radio frequency (RF) blocks on the same die to save space. These sensitive blocks may be located on the same die as noisy digital processing circuits. The switching noise generated by the digital core may propagate through the power and ground distribution network to the analog/RF blocks, causing degraded performance. The problem may be aggravated by technology scaling and package pin count limits because, as more and more transistors and functions are implemented in the same die, there is more switching noise. The problem is compounded by the limited number of power and ground pins, which facilitates noise coupling.

DAC signals are sensitive mixed signals that are susceptible to code dependent noise that appears as a spur in the output spectrum. In some applications the spur desensitizes the receive path in a corresponding band. There is a need in the art for a method and apparatus for attenuating DAC spurs in receive bands.

SUMMARY

Embodiments contained in the disclosure provide a method for attenuating transmit digital to analog converter (DAC) spurs. The method begins when a reference voltage is injected into an amplifier. Next, an output of the ground low drop-out regulator is measured and is then compared with the reference voltage. The output of the amplifier is then adjusted based on the results of the comparison. If the reference voltage is higher then the output of the ground low drop-out regulator the output of the amplifier is adjusted to ground. If the reference voltage is lower than the output of the ground low drop-out regulator then the output of the amplifier is adjusted to match the reference voltage.

A further embodiment provides an apparatus for attenuating transmit DAC spurs. The apparatus includes an amplifier, a first transistor in communication with the amplifier, a second transistor in communication with the first transistor, a third transistor in communication with the second transistor, a fourth transistor in communication with the first and second transistors; and a ground low drop-out regulator (GND LDO). The transistors may be metal-oxide-silicon field effect transistors (MOSFETs), or other suitable transistor. In addition, the amplifier may be an inverting amplifier.

A further embodiment provides an apparatus for attenuating spurs in a transmit DAC. The apparatus includes: means for injecting a reference voltage into an amplifier; means for measuring an output of a ground low drop-out regulator; means for comparing an output of the ground low drop-out regulator with the reference voltage; and means for adjusting an output of the amplifier based on the comparison.

A yet further embodiment provides a non-transitory computer-readable medium containing instructions, which when executed cause a processor to perform the steps of: injecting a reference voltage into an amplifier; measuring an output of a ground low drop-out regulator; comparing the output of the ground low drop-out regulator with the reference voltage; and adjusting an output of the amplifier based on the comparison.

DETAILED DESCRIPTION

Figure 1:
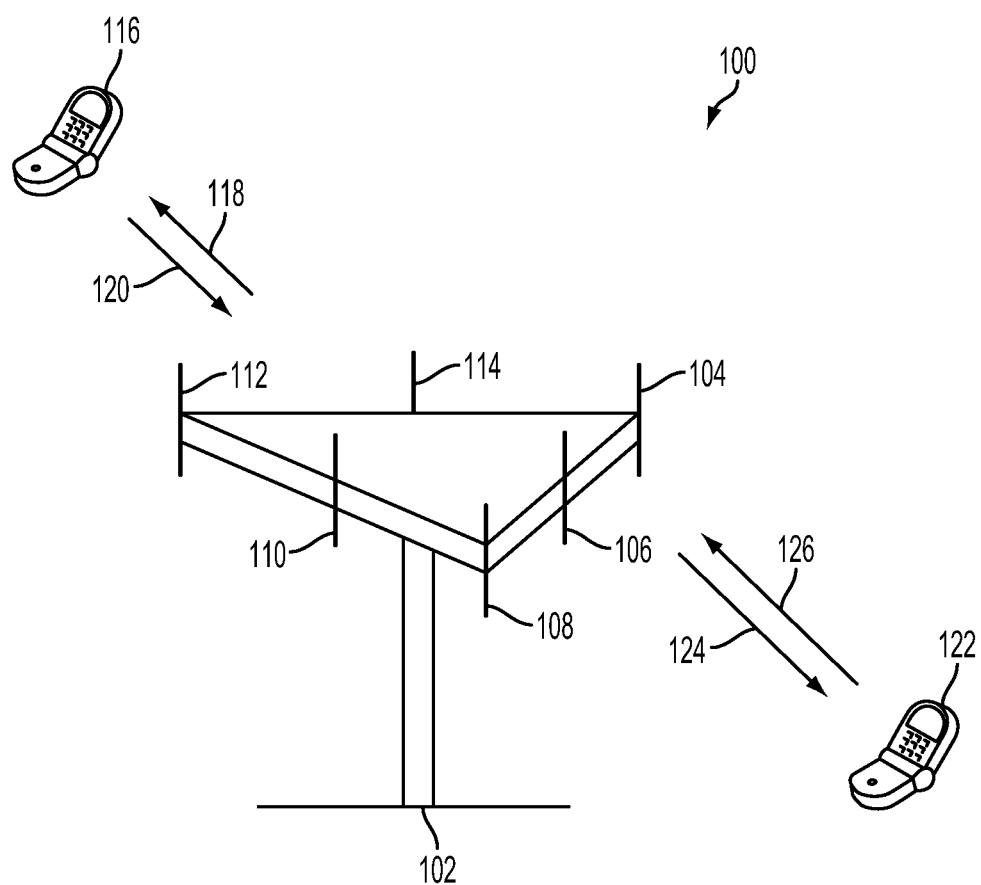
FIG. 1 illustrates a wireless multiple-access communication system, in accordance with certain embodiments of the disclosure.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Furthermore, various aspects are described herein in connection with an access terminal and/or an access point. An access terminal may refer to a device providing voice and/or data connectivity to a user. An access wireless terminal may be connected to a computing device such as a laptop computer or desktop computer, or it may be a self-contained device such as a cellular telephone. An access terminal can also be called a system, a subscriber unit, a subscriber station, mobile station, mobile, remote station, remote terminal, a wireless access point, wireless terminal, user terminal, user agent, user device, or user equipment. A wireless terminal may be a subscriber station, wireless device, cellular telephone, PCS telephone, cordless telephone, a Session Initiation Protocol (SIP) phone, a wireless local loop (WLL) station, a personal digital assistant (PDA), a handheld device having wireless connection capability, or other processing device connected to a wireless modem. An access point, otherwise referred to as a base station or base station controller (BSC), may refer to a device in an access network that communicates over the air-interface, through one or more sectors, with wireless terminals. The access point may act as a router between the wireless terminal and the rest of the access network, which may include an Internet Protocol (IP) network, by converting received air-interface frames to IP packets. The access point also coordinates management of attributes for the air interface.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuring description, the accompanying drawings and the appended claims.

FIG. 1 illustrates a multiple access wireless communication system 100 according to one aspect. An access point 102 (AP) includes multiple antenna groups, one including 104 and 106, another including 108 and 110, and an additional one including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over downlink or forward link 118 and receive information from access terminal 116 over uplink or reverse link 120. Access terminal 122 is in communication with antennas 106 and 108, where antennas 106 and 108 transmit information to access terminal 122 over downlink or forward link 124, and receive information from access terminal 122 over uplink or reverse link 126. Access terminal 122 may have multiple transmitters and antennas to provide improved service. In a frequency division duplex (FDD) system, communication link 118, 120, 124, and 126 may use a different frequency for communication. For example, downlink or forward link 118 may use a different frequency than that used by uplink or reverse link 120.

Each group of antennas and/or the area in which they are designed to communicate is often referred to as a sector of the access point. In an aspect, antenna groups are each designed to communicate to access terminals in a sector of the areas covered by access point 102.

In communication over downlinks or forward links 118 and 124, the transmitting antennas of an access point utilize beamforming in order to improve the signal-to-noise ration (SNR) of downlinks or forward links for the different access terminals 116 and 122. Also, an access point using beamforming to transmit to access terminals scattered randomly through its coverage causes less interference to access terminals in neighboring cells than an access point transmitting through a single antenna to all its access terminals.

An access point may be a fixed station used for communicating with the terminals and may also be referred to as a Node B, an evolved Node B (eNB), or some other terminology. An access terminal may also be called a mobile station, user equipment (UE), a wireless communication device, terminal or some other terminology. For certain aspects, either the AP 102, or the access terminals 116, 122 may utilize the techniques described below to improve performance of the system.

Figure 2:
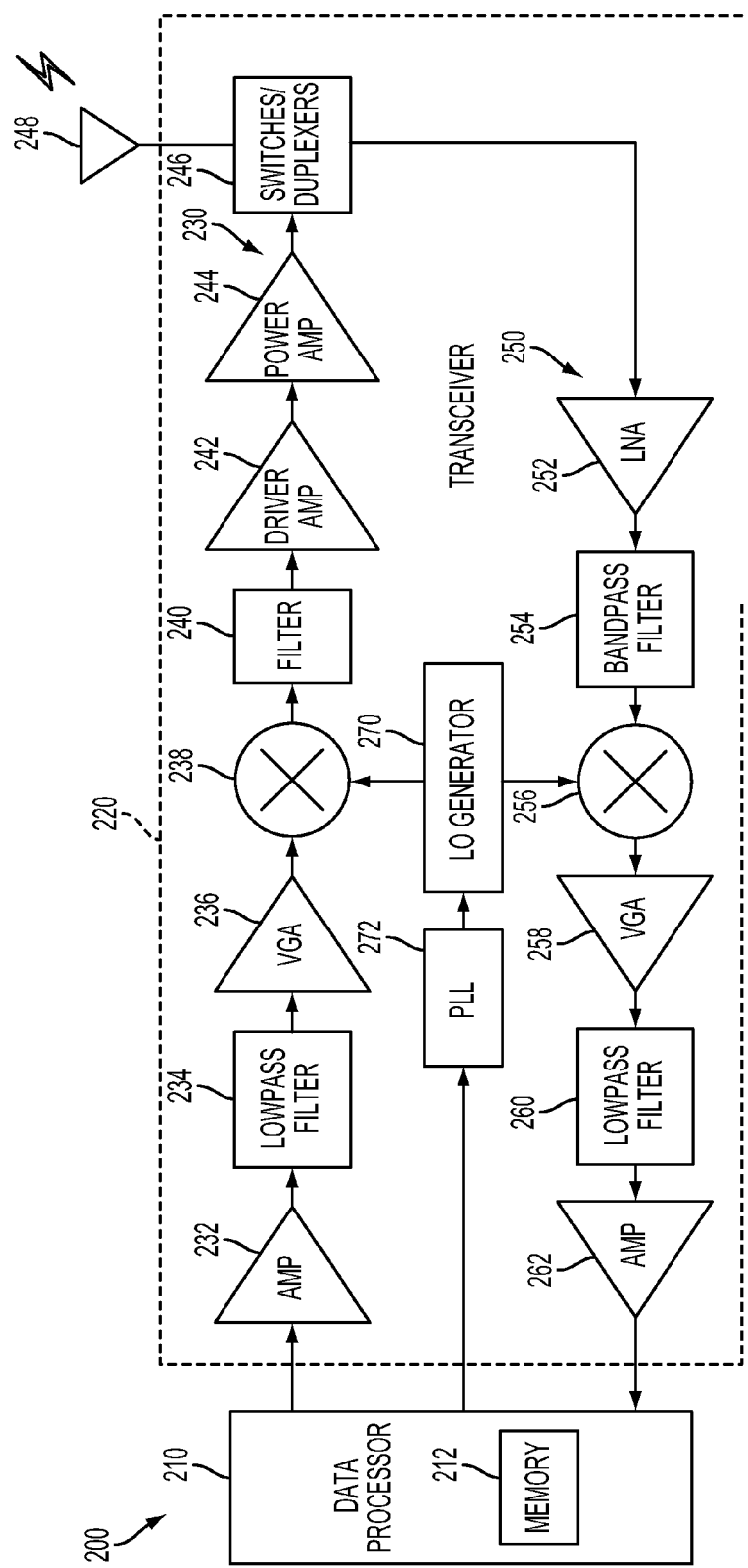
FIG. 2 is a block diagram of a wireless communication system in accordance with embodiments of the disclosure.

FIG. 2 shows a block diagram of an exemplary design of a wireless communication device 200. In this exemplary design, wireless device 200 includes a data processor 210 and a transceiver 220. Transceiver 220 includes a transmitter 230 and a receiver 250 that support bi-directional wireless communication. In general, wireless device 200 may include any number of transmitters and any number of receivers for any number of communication systems and any number of frequency bands. Each transmitter and antenna on a wireless communication device 200 emits RF radiation.

In the transmit path, data processor 210 processes data to be transmitted and provides an analog output signal to transmitter 230. Within transmitter 230, the analog output signal is amplified by an amplifier (Amp) 232, filtered by a lowpass filter 234 to remove images caused by digital-to-analog conversion, amplified by a VGA 236, and upconverted from baseband to RF by a mixer 238. The upconverted signal is filtered by a filter 240, further amplified by a driver amplifier, 242 and a power amplifier 244, routed through switches/duplexers 246, and transmitted via an antenna 249.

In the receive path, antenna 248 receives signals from base stations and/or other transmitter stations and provides a received signal, which is routed through switches/duplexers 246 and provided to receiver 250. Within receiver 250, the received signal is amplified by an LNA 252, filtered by a bandpass filter 254, and downconverted from RF to baseband by a mixer 256. The downconverted signal is amplified by a VGA 258, filtered by a lowpass filter 260, and amplified by an amplifier 262 to obtain an analog input signal, which is provided to data processor 210.

FIG. 2 shows transmitter 230 and receiver 250 implementing a direct-conversion architecture, which converts a signal between RF and baseband in one stage. Transmitter 230 and/or receiver 250 may also implement a super-heterodyne architecture, which frequency converts a signal between RF and baseband in multiple stages. A local oscillator (LO) generator 270 generates and provides transmit and receive LO signals to mixers 238 and 256, respectively. A phase locked loop (PLL) 272 receives control information from data processor 210 and provides control signals to LO generator 270 to generate the transmit and receive LO signals at the proper frequencies.

FIG. 2 shows an exemplary transceiver design and wireless device 200 may contain multiple transceivers. In general, the conditioning of the signals in transmitter 230 and receiver 250 may be performed by one or more stages of amplifier, filter, mixer, etc. These circuits may be arranged differently from the configuration shown in FIG. 2. Some circuits in FIG. 2 may also be omitted. All or a portion of transceiver 220 may be implemented on one or more analog integrated circuits (ICs), RF ICs (RFICs), mixed-signal ICs, etc. For example, amplifier 232 through power amplifier 244 in transmitter 230 may also be implemented on an RFIC. Driver amplifier 242 and power amplifier 244 may also be implemented on another IC external to the RFIC.

Data processor 210 may perform various functions for wireless device 200, e.g., processing for transmitter and received data. Memory 212 may store program codes and data for data processor 210. Data processor 210 may be implemented on one or more application specific integrated circuits (ASICs) and/or other ICs.

Modern SoCs integrate sensitive analog/RF blocks on the same die as noisy digital processing circuits. Switching noise may be caused by the operation of multiple switches. The switching noise generated by the digital core may propagate through the power and ground distribution network to the analog/RF blocks, and may cause performance degradation. The problem may be aggravated with technology scaling and package pin count limits because as more and more transistors and functions are implemented in a single chip there is more switching noise. In addition, the noise coupling may be facilitated because of the limited number of power and ground pins on the device.

Figure 3:
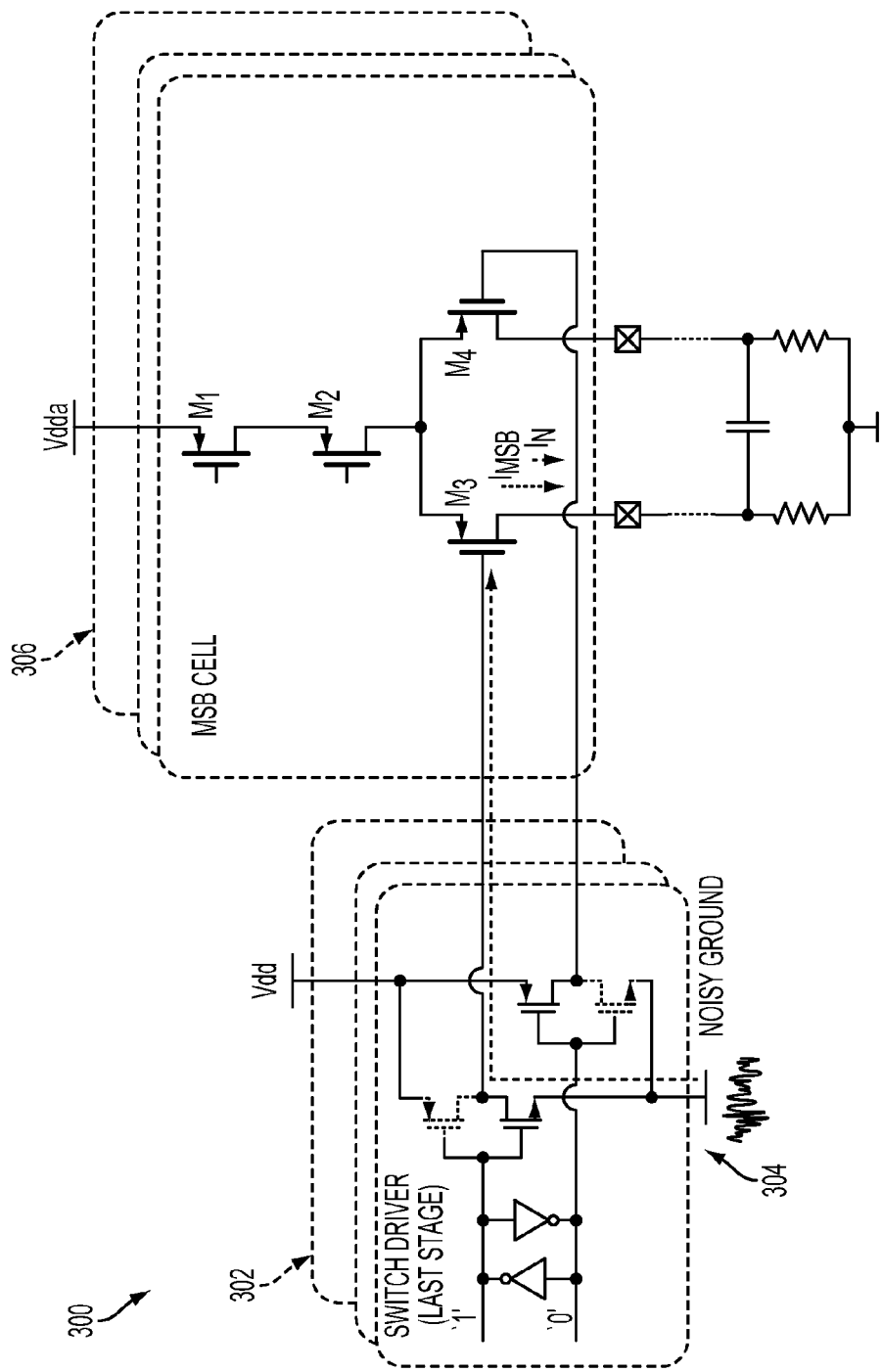
FIG. 3 is a schematic diagram illustrating a noise ground desensitizing receiver bands in accordance with embodiments of the disclosure.

FIG. 3 depicts an apparatus 300 that includes a typical current steering DAC most significant bit (MSB) cell 306 and the last stage of its switch driver 302. Each cell consists of a p-channel metal-oxide semiconductor (PMOS) current source, M1 and M2 within MSB cell 306, and a pair of PMOS switches, M3 and M4 within MSB cell 306. The switch driver 302 is a digital circuit. Switch driver 302 shares the ground with many other digital circuits on the chip. The PMOS current sources and switches are used more frequently than are n-channel metal-oxide semiconductor (NMOS) devices, especially when the next block in the signal chain does not reside on the same die as the DAC.

In operation the PMOS switch is turned on when its gate is shorted to ground through an NMOS in the switch driver 302. At this time the noise at the switch driver 302 ground 304 may modulate the voltage $V_{GS}$ of the switch transistor, M3 in MSB cell 306. This results in a noise current $I_N$ in addition to the normal current $I_{MSB}$. In a typical wireless modem SoC this ground noise includes not only white noise, but also colored noise, which is cause by transmit crystal oscillator (TCXO) impulse currents and modem transmit (TxFE) operation. The above mechanism allows ground noise to contaminate the DAC output. The resultant noise current $I_N$ is code dependent, and as a result, appears as a spur at $|f_{signal}+/-f_{noise}|$ in the DAC output spectrum, where $f_{signal}$ is the DAC input frequency and $f_{noise}$ is the ground noise frequency. In frequency division duplex (FDD) applications, this spur desensitizes the receive path in the corresponding band, leading to poor quality reception.

Embodiments described in this disclosure provide a method that overcomes the difficulties described above. In order to overcome the ground noise inducted spur, a ground low drop-out regulator (GND LDO) is incorporated, as described in further detail below.

Figure 4:
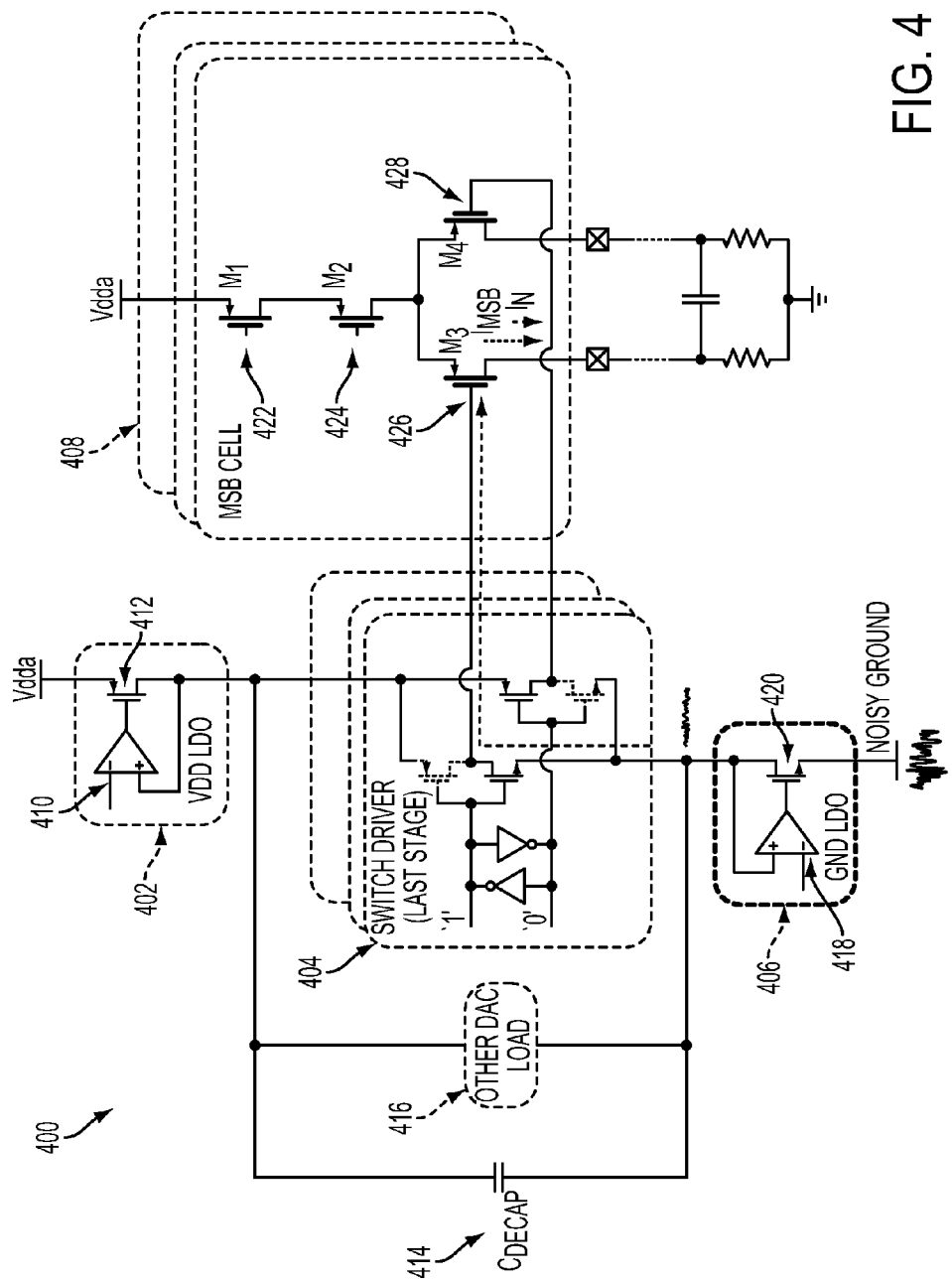
FIG. 4 is a block diagram of an apparatus for attenuating a DAC spur using a ground low drop-out regulator, in accordance with embodiments of the disclosure.

FIG. 4 illustrates an apparatus for reducing ground noise spurs in a DAC receive band. The apparatus 400 includes a GND LDO 406 that attenuates the noise at the noise ground and provides a clean "ground" to the DAC core. GND LDO 406 includes an amplifier 418 and transistor 420. The apparatus also includes a voltage low drop-out regulator (VDD LDO) 402. VDD LDO includes an amplifier 410 and a transistor 412. VDD LDO 402 is connected to a capacitor $C_{DECAP}$ 414, other DAC load 416, and the last stage switch driver 404. Last stage switch driver 404 is connected to $C_{DECAP}$ 414, other DAC load 416, GND LDO 406, and MSB cell 408. MSB cell 408 includes PMOS transistors 422 and 424 as well as PMOS switches 426 and 428.

GND LDO 406 is used to attenuate the noise at the noisy ground and provides a clean "ground" to the DAC core. The DAC core may also includes switch driver 404 and clock buffers, as well as other additional blocks not discussed. A further embodiment provides a decoupling capacitor $C_{DECAP}$ 414 in parallel to provide dynamic current.

Figure 5:
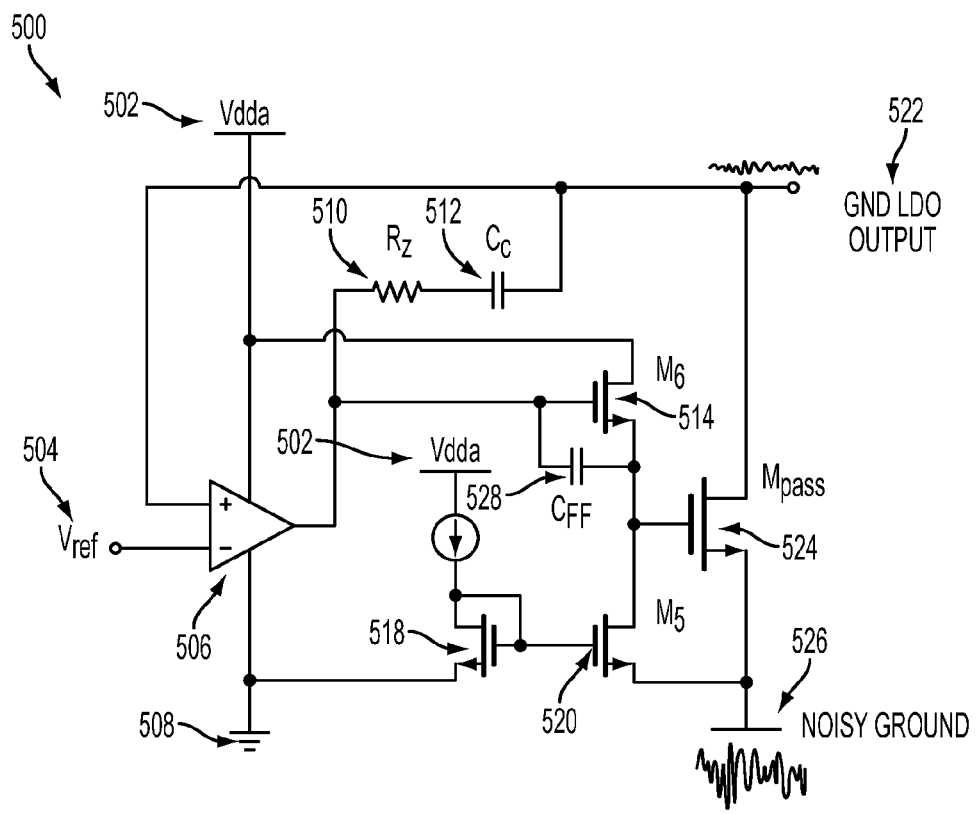
FIG. 5 is a block diagram of a ground low drop-out regulator in accordance with embodiments of the disclosure.

FIG. 5 is a block diagram of a ground low drop-out regulator (GND LDO) in accordance with embodiments described herein. The assembly 500 includes an error amplifier 506, a source follower stage comprised of M5 520 and M6 514, a compensation network, and the pass transistor $M_{pass}$ 524. The source of M5 220 is connected to noisy ground 526 so that M5 520 may sense the noise and work in conjunction with M6 514 as a common gate unity gain amplifier to hold the $V_{GS}$ of the pass transistor $M_{pass}$ 524 within a desired bandwidth. $C_{FF}$ 528 is used to increase the high frequency gain of the common gate amplifier, thus effectively extend the bandwidth for noise rejection. Resistor $R_Z$ 510 and capacitor $C_C$ 512 ensure that the GND LDO 500 loop is stable across the entire range of load current.

In operation, a LDO regulator is a direct current (DC) voltage regulator which can regulate the output voltage even when the supply voltage is very close to the output voltage. The advantages of a LDO regulator over other DC to DC regulators include: lower switching noise (as no switching occurs), smaller device size (no large inductors or transformers required), and greater design simplicity. Typically, the LDO design incorporates a reference, an amplifier, and a pass element. One drawback is that linear DC regulators must dissipate power across the regulation device in order to regulate the output voltage.

The main components of a LDO regulator are a power field effect transistor (FET) and an error amplifier. One input of the error amplifier 506 monitors the fraction of an output determined by a resistor ratio between two resistors, or inputs. In an embodiment, the input is GND LDO output 522, which is input on the positive terminal of error amplifier 506. The second input to error amplifier 506 is from a stable voltage reference, here $V_{ref}$ 504, which is input on the negative terminal of error amplifier 506. If an output voltage rises too high relative to the reference voltage, then the transistors M5 520, M6 514, and $M_{pass}$ 524 adjust to maintain a constant voltage. As noted above, Resistor $R_Z$ 510 and capacitor $C_C$ 512 help to ensure the stability of the feedback loop for the entire range of possible loading current.

Transistor 518 connects constant current source 502 to create a bias voltage for M5 520 working in combination with M6 514 as a source follower stage for error amplifier output signal to regulate $M_{pass}$ 524, and as a common gate amplifier sensing the noisy ground 526 noise and attenuates output noise of GND LDO 522.

In operation a voltage reference Vref 504 is injected into the inverting (−input) of operational amplifier 506. The circuit output, GND LDO output 522, is injected into the non-inverting input of operational amplifier 506 (+input). The output of operational amplifier 506 is inserted into the non-inverting side of operational amplifier 506 through a resistor $R_Z$ 510 and capacitor $C_C$ 512. The output of operational amplifier 506 is also injected into the gate of a first n-channel metal-oxide-silicon field effect transistor (N-channel MOSFET) $M_6$ 514. The first n-channel MOSFET $M_6$ 514 drain is connected to Vdda 502. First n-MOSFET $M_6$ 514 has its source connected to the drain of second n-MOSFET $M_5$ 520. Capacitor $C_{FF}$ 528 is connected across the gate and source of $M_6$ 514. The source of $M_5$ 520 is connected to noisy ground 526.

Reference: a current source is connected between Vdda 502 and the gate and drain of a third n-MOSFET 518. The source of n-MOSFET 518 is connected to low noise analog ground 508. The gate of n-MOSFET 518 is connected to the gate of $M_5$ 520. This biases $M_5$ 520 into a common gate amplifier configuration. The source of first n-MOSFET $M_6$ 514 is also connected to the gate of fourth n-MOSFET $M_{pass}$ 524. The drain of fourth n-MOSFET $M_{pass}$ 524 is connected to GND LDO output 522. The source of fourth n-MOSFET $M_{pass}$ 524 is connected to noisy ground 526.

The biasing by operational amplifier 506 through first n-MOSFET $M_6$ 514 and the biasing by constant current source between vdda 502 and third n-MOSFET 518 together with a second n-MOSFET 520, draw the signal from the noisy ground and creates a non-inverting signal that biases the gate of fourth n-MOSFET $M_{pass}$ 524. Fourth n-MOSFET $M_{pass}$ 524 reduces the noise of the GND LDO 522.

Figure 6:
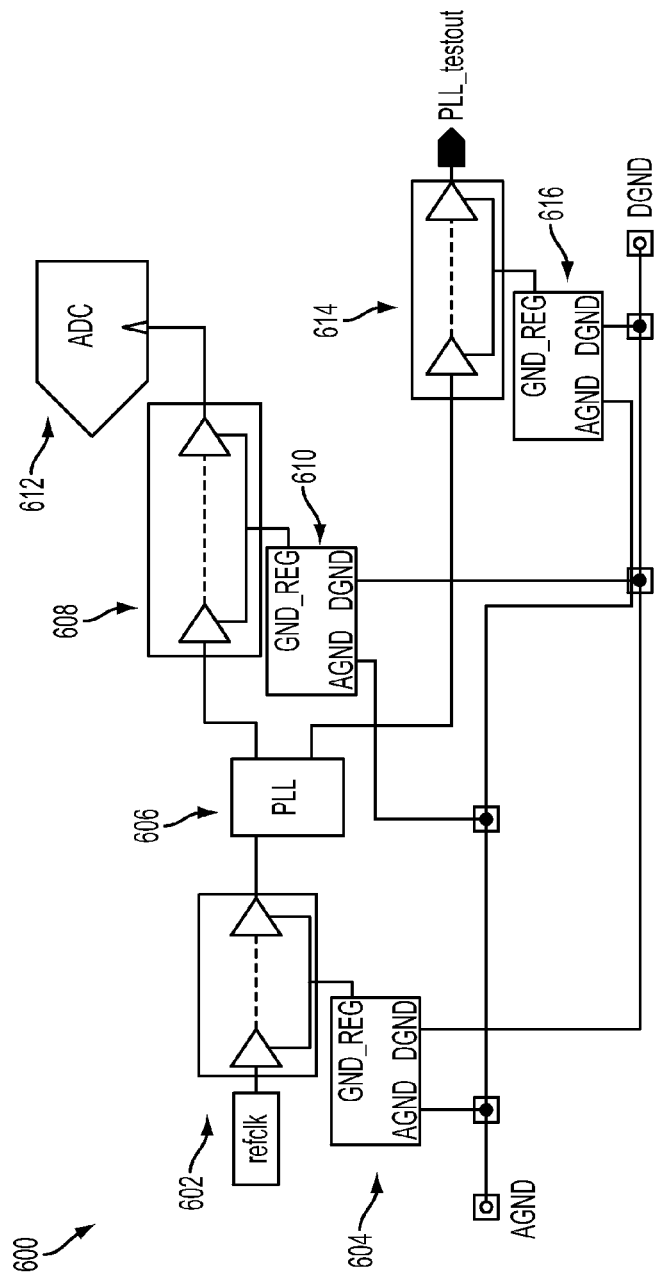
FIG. 6 is a block diagram of an apparatus for sharing digital grounding and noise isolation among multiple cores, in accordance with embodiments of the disclosure.

FIG. 6 illustrates extending the concept to chips with multiple cores. The assembly 600, includes first core 602, with first GND LDO 604 operating to attenuate any spurs that core 602 could potentially pick up from a shared noisy digital ground (DGND). The output from first core 602 is input to phase locked loop (PLL) 606. The output from PLL 606 is input to second core 608. Second GND LDO 610 operates to attenuate spurs on noisy ground (GND) that could contaminate the signals produced by second core 608. The output from second core 608 is input to analog to digital converter (ADC) 612. A second output from PLL 606 is input to third core 614. GND LDO 616 operates to reject noise on noisy ground DGND and prevent contaminating the signals produced by third core 614. As shown in FIG. 6, the use of GND LDOs may be extended to other analog/mixed signal designs where performance may be subject to ground noise.

Figure 7:
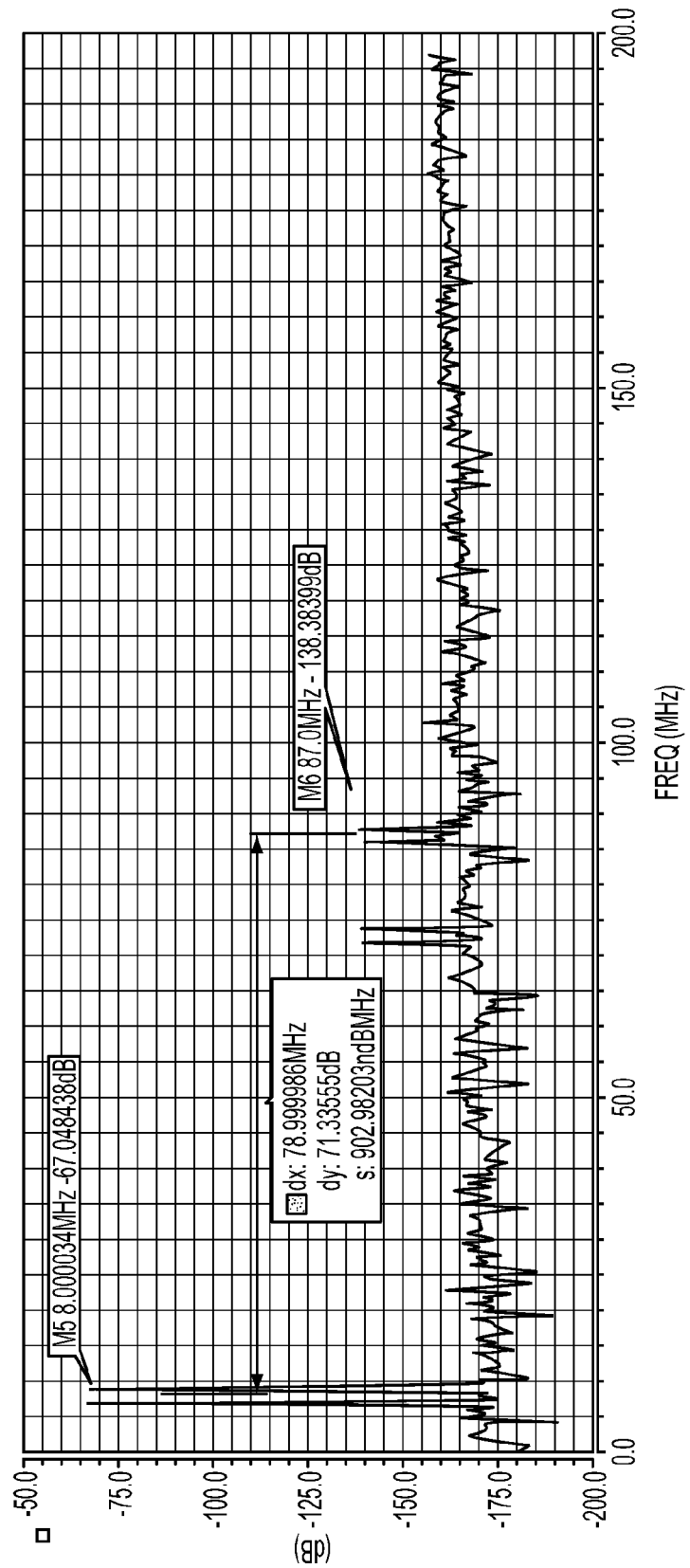
FIG. 7 illustrates a DAC output spectrum for a signal without embodiments of the disclosure.

FIG. 7 illustrates a simulated DAC output spectrum, In the simulation a 79 MHz 5 mVpp SINE noise is injected into the switch driver ground 304 and the two-tone DAC input signals are at 6 MHz and 8 MHz, respectively. The ground noise may be seen to introduce four −71 dBc spurs at 73 MHz, 85 MHz, 71 MHz, and 87 MHz. Spurs such as these will largely desensitize the receive signal chain and need to be reduced.

Figure 8:
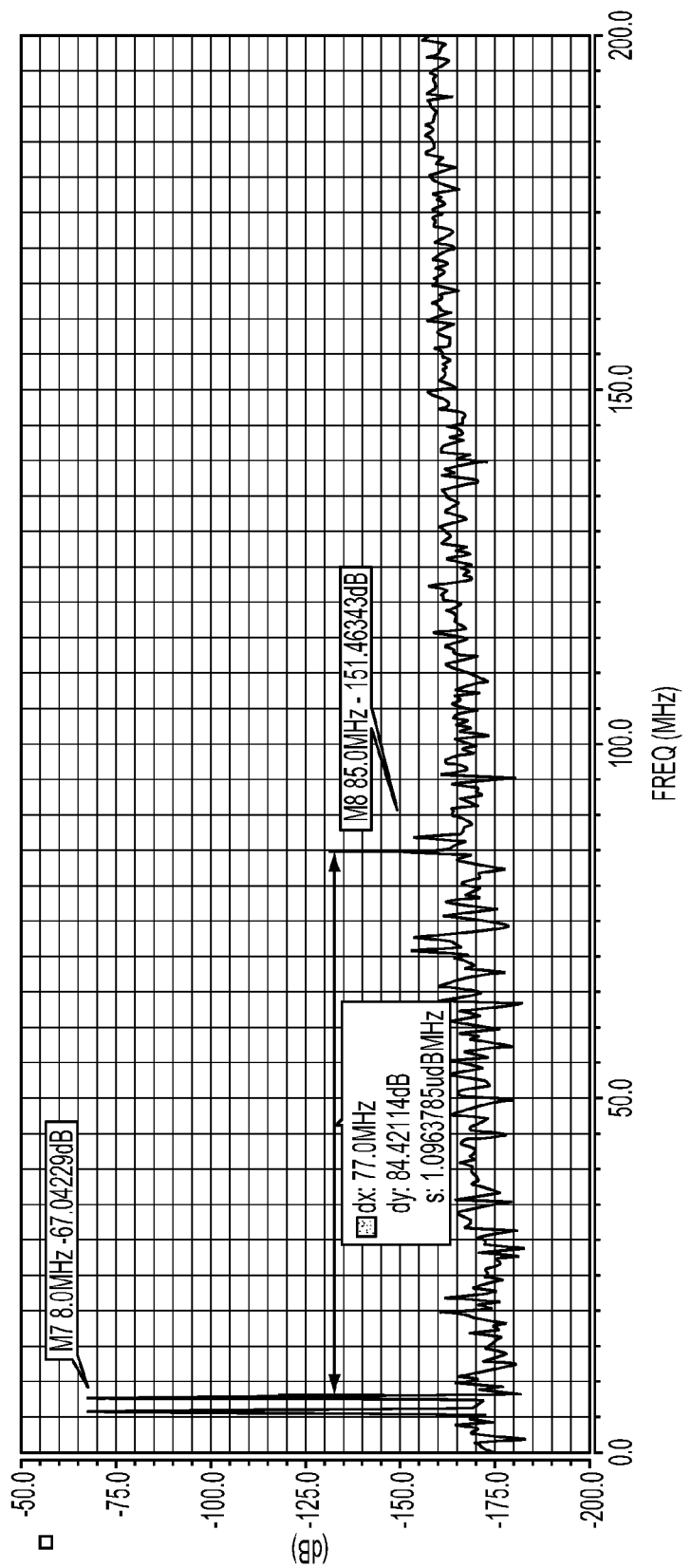
FIG. 8 illustrates a DAC output spectrum with a ground low drop-out regulator in accordance with embodiments of the disclosure.

FIG. 8 illustrates the improvement possible using GND LDO to attenuate spurs in the DAC output spectrum. The simulation conditions in FIG. 8 are the same as presented in FIG. 7. However, by using a GND LDO the DAC spur has been attenuated by 13 dB, and is now in an acceptable range. The simulation shows that the receive band performance may be improved without degrading other receive bands.

Figure 9:
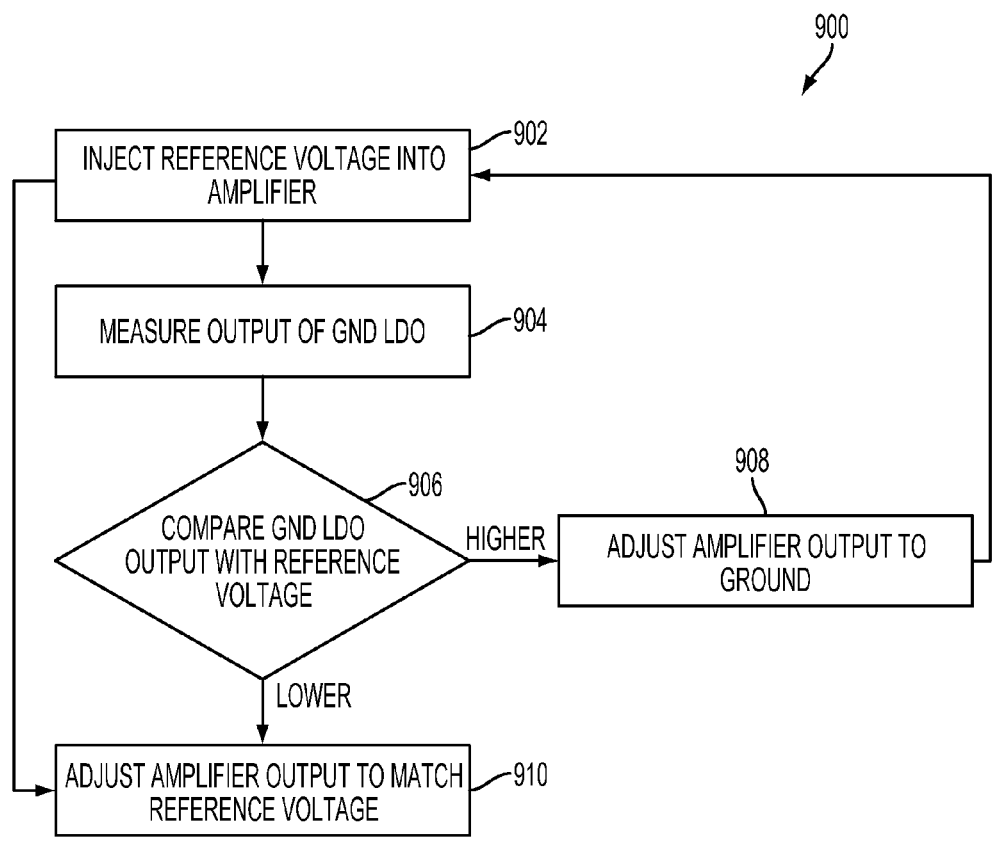
FIG. 9 is a flow diagram of a method for DAC spur attenuation in accordance with embodiments of the disclosure.

FIG. 9 is a flowchart of a method of attenuating a DAC spur in accordance with embodiments described herein. The method 900 begins at step 902 with the injection of a reference voltage into an amplifier. In step 904 the output of a ground low drop-out regulator (GND LDO) is measured. In step 906 the output of the GND LDO is compared with a reference voltage. If the measured output of the GND LDO is higher than the reference voltage, then in step 908 the amplifier output is adjusted to ground. If the comparison indicates that the GND LDO output is lower than the reference voltage then in step 910 the amplifier output is adjusted to the reference voltage. After adjustments are made as described above in steps 908 and 910, the process begins again at step 902.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of attenuating spurs in a digital to analog converter (DAC), comprising:
   injecting a reference voltage into an amplifier;
   measuring an output of a ground low drop-out regulator;
   comparing an output of the ground low drop-out regulator with the reference voltage; and
   adjusting an output of the amplifier based on the comparison.

2. A method of attenuating spurs in a digital to analog converter (DAC), comprising:
   injecting a reference voltage into an amplifier;
   measuring an output of a ground low drop-out regulator;
   comparing an output of the ground low drop-out regulator with the reference voltage; and
   adjusting an output of the amplifier based on the comparison wherein if the output comparison indicates the reference voltage is higher than the output of the ground low drop-out regulator, adjusting the output of the amplifier to ground.

3. The method of claim 2, wherein adjusting the output of the amplifier comprises:
   biasing a pass transistor to a specified conducting condition;
   routing a noisy ground signal to the biased pass transistor; and
   changing the conductivity of the biased pass transistor to a portion of the noisy signal.

4. The method of claim 3, wherein the portion of the noisy ground signal whose conductivity is changed is an alternating current (AC) portion of the noisy ground signal.

5. A method of attenuating spurs in a digital to analog converter (DAC), comprising:
   injecting a reference voltage into an amplifier;
   measuring an output of a ground low drop-out regulator;
   comparing an output of the ground low drop-out regulator with the reference voltage; and
   adjusting an output of the amplifier based on the comparison wherein if the output comparison indicates the reference voltage is lower than the output of the ground low drop-out regulator, adjusting the output of the amplifier to match the reference voltage.

6. The method of claim 5, wherein adjusting the output of the amplifier comprises:
   biasing a pass transistor to a specified conducting condition;
   routing a noisy ground signal to the biased pass transistor; and
   changing the conductivity of the biased pass transistor to a portion of the noisy signal.

7. The method of claim 6, wherein the portion of the noisy ground signal whose conductivity is changed is an alternating current (AC) portion of the noisy signal.

8. An apparatus for transmit digital to analog converter (DAC) spur attenuation, comprising:
   an amplifier;
   a first transistor in communication with the amplifier;
   a second transistor in communication with the first transistor;
   a third transistor in communication with the second transistor;
   a fourth transistor in communication with the first and second transistors; and
   a ground low drop-out regulator (GND LDO).

9. The apparatus of claim 8, wherein the first, second, third, and fourth transistors are metal-oxide-silicon field effect transistors (MOSFETs).

10. The apparatus of claim 8, wherein the amplifier is an inverting amplifier.

11. The apparatus of claim 8, wherein the GND LDO is connected to the fourth transistor.

12. An apparatus for transmit digital to analog converter (DAC) spur attenuation, comprising:

an amplifier;
a first transistor in communication with the amplifier;
a second transistor in communication with the first transistor;
a third transistor in communication with the second transistor;
a fourth transistor in communication with the first and second transistors; and
a ground low drop-out regulator (GND LDO), wherein the GND LDO is connected to the fourth transistor, and further wherein the fourth transistor is also connected to a noisy ground.

13. An apparatus for attenuating spurs in a transmit digital to analog converter (DAC), comprising:
means for injecting a reference voltage into an amplifier;
means for measuring an output of a ground low drop-out regulator;
means for comparing an output of the ground low drop-out regulator with the reference voltage; and
means for adjusting an output of the amplifier based on the comparison.

14. An apparatus for attenuating spurs in a transmit digital to analog converter (DAC), comprising:
means for injecting a reference voltage into an amplifier;
means for measuring an output of a ground low drop-out regulator;
means for comparing an output of the ground low drop-out regulator with the reference voltage; and
means for adjusting an output of the amplifier based on the comparison; and
further comprising: means for adjusting the output of the amplifier to ground if the output comparison indicates the reference voltage is higher than the output of the ground low drop-out regulator.

15. The apparatus of claim 14, further comprising:
means for biasing a pass transistor to a specified conducting condition;
means for routing a noisy ground signal to the biased pass transistor; and
means for changing the conductivity of the biased pass transistor to a portion of the noisy ground signal.

16. An apparatus for attenuating spurs in a transmit digital to analog converter (DAC), comprising:
means for injecting a reference voltage into an amplifier;
means for measuring an output of a ground low drop-out regulator;
means for comparing an output of the ground low drop-out regulator with the reference voltage;
means for adjusting an output of the amplifier based on the comparison; and
further comprising: means for adjusting the output of the amplifier to match the reference voltage if the comparison indicates that the output of the ground low drop-out regulator is lower than the reference voltage.

17. The apparatus of claim 16, further comprising:
means for biasing a pass transistor to a specified conducting condition;
means for routing a noisy ground signal to the biased pass transistor; and
means for changing the conductivity of the biased pass transistor to a portion of the noisy ground signal.

18. A non-transitory computer-readable medium containing instructions, which when executed cause a processor to perform the steps of: injecting a reference voltage into an amplifier;
injecting a reference voltage into an amplifier;
measuring an output of a ground low drop-out regulator;
comparing an output of the ground low drop-out regulator with the reference voltage; and
adjusting an output of the amplifier based on the comparison.

19. A non-transitory computer-readable medium containing instructions, which when executed cause a processor to perform the steps of: injecting a reference voltage into an amplifier;
injecting a reference voltage into an amplifier;
measuring an output of a ground low drop-out regulator;
comparing an output of the ground low drop-out regulator with the reference voltage; and
adjusting an output of the amplifier based on the comparison; and
further comprising instructions for adjusting the output of the ground low drop-out regulator to ground if the reference voltage is higher than the output of the ground low drop-out regulator.

20. The non-transitory computer-readable medium of claim 19, further comprising instructions for adjusting the output of the ground low drop-out regulator to match the reference voltage if the comparison indicates that the reference voltage is lower than the output of the ground low drop-out regulator.

21. The non-transitory computer-readable medium of claim 20, further comprising instructions for adjusting the output of the amplifier;
biasing a pass transistor to a specified conducting condition;
routing a noisy ground signal to the biased pass transistor; and
changing the conductivity of the biased pass transistor to a portion of the noisy ground signal.

22. The non-transitory computer-readable medium of claim 19, further comprising instructions for adjusting the output of the amplifier:
biasing a pass transistor to a specified conducting condition;
routing a noisy ground signal to the biased pass transistor; and
changing the conductivity of the biased pass transistor to a portion of the noisy ground signal.

* * * * *